(12) United States Patent
Ruengeler et al.

(10) Patent No.: US 11,137,444 B2
(45) Date of Patent: Oct. 5, 2021

(54) MEASUREMENT DEVICE AND METHOD OF SETTING A MEASUREMENT DEVICE

(71) Applicant: Rohde & Schwarz GmbH & Co. KG, Munich (DE)

(72) Inventors: Matthias Ruengeler, Munich (DE); Florian Ramian, Munich (DE); Michael Simon, Munich (DE); Alexander Roth, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 131 days.

(21) Appl. No.: 16/457,585

(22) Filed: Jun. 28, 2019

(65) Prior Publication Data
US 2020/0408837 A1 Dec. 31, 2020

(51) Int. Cl.
*G01R 31/317* (2006.01)
*G01R 31/319* (2006.01)
*G06F 3/0488* (2013.01)

(52) U.S. Cl.
CPC . *G01R 31/31718* (2013.01); *G01R 31/31908* (2013.01); *G06F 3/0488* (2013.01)

(58) Field of Classification Search
CPC ........ G01R 31/31718; G01R 31/31908; G01R 31/31903; G01R 15/08; G01R 15/09
See application file for complete search history.

(56) References Cited

U.S. PATENT DOCUMENTS

| 4,607,215 A | * | 8/1986 | Takano | G01R 23/16 324/76.23 |
| 6,359,429 B1 | | 3/2002 | Arai et al. | |
| 2008/0054880 A1 | * | 3/2008 | Miyauchi | G01R 15/08 324/76.29 |
| 2008/0201054 A1 | | 8/2008 | Grichnik et al. | |

FOREIGN PATENT DOCUMENTS

EP 1363005 A2 11/2003

* cited by examiner

*Primary Examiner* — Manuel L Barbee
(74) *Attorney, Agent, or Firm* — Christensen O'Connor Johnson Kindness PLLC

(57) ABSTRACT

A measurement device with automatic optimization capabilities comprises at least one signal processing component with a physical detector and a virtual detector component comprising at least one virtual detector for a signal processing component without physical detector. The physical detector is configured to physically measure a measurement value assigned to the signal processing component. The virtual detector component is configured to use a model of a signal processing chain from the physical detector to the location of the virtual detector. The model comprises at least one model parameter for the signal processing chain. The measurement device is configured to adapt the virtual detector component with respect to a measurement type for the signal to be measured. The virtual detector component is configured to use the model and the at least one measurement value. The virtual detector component is configured to determine a virtually determined value based on the model (Continued)

and the at least one measurement value. The measurement device is configured to use the virtually determined value to determine a setting for the measurement device. In addition, a method of setting a measurement device is described.

16 Claims, 2 Drawing Sheets

MEASUREMENT DEVICE AND METHOD OF SETTING A MEASUREMENT DEVICE

FIELD OF THE DISCLOSURE

Embodiments of the present disclosure relate to a measurement device with automatic optimization capabilities. Furthermore, embodiments of the present disclosure relate to a method of setting a measurement device.

BACKGROUND

In high-performance measurements of signals outputted by a device under test (DUT), an infinite number of parameters have an influence on the quality of the measurement results. These parameters relate to the device under test, but also to the measurement device with which the device under test is connected. Typically, the operator of the measurement device is not aware of all influencing parameters related to the measurement device.

Modern measurement devices issue overload error messages, which indicate a certain measurement as invalid if an overload criterion was met, for instance by a physically measured measurement value. This is appropriate for e.g. analog-to-digital converters (ADCs), where a hard clipping threshold applies. This hard clipping threshold can be used, for instance by an auto-level, to optimize the signal level.

In contrast, other signal processing components in the signal path, like mixers, produce distortion that increases with increasing input power. Hence, no hard threshold applies that invalidates the measurement. Depending on the type of measurement, more or less distortion introduced by the measurement device is acceptable. In other words, the threshold depends on the measurement type. Thus, a respective setting of the measurement device, particularly values of the parameters, may result in optimum measurement results. These settings have to be done by the operator manually.

However, the operator usually does not know how to set the respective influencing parameters in order to obtain optimum measurement results even though the operator is aware of the fact that the measurement device has influencing parameters. Hence, it is complicated to identify the optimum values for the influencing parameters, as the respective values also depend on the intended type of measurement. In other words, the influencing parameters associated with the measurement device have to be set to different values dependent on the type of measurement intended.

Thus, the operator has to be an expert of the specific measurement device in order to identify the influencing parameters (for the measurement type) and to configure the measurement device in an optimum manner, namely by setting the optimum values for the influencing parameters.

Accordingly, there is a need for a simpler possibility to set a measurement device in an optimum manner in order to enable unexperienced operators to use the respective measurement device.

SUMMARY

Embodiments of the present disclosure provide a measurement device with automatic optimization capabilities. In some embodiments, the measurement device has at least one signal processing component with a physical detector configured to physically measure a measurement value assigned to the signal processing component. The measurement device also has a virtual detector component comprising at least one virtual detector for a signal processing component without physical detector. The virtual detector component is configured to use a model of a signal processing chain from the physical detector to the location of the virtual detector. The model comprises at least one model parameter for the signal processing chain. The measurement device is configured to adapt the virtual detector component with respect to a measurement type for the signal to be measured. The virtual detector component is configured to use the model and the at least one measurement value. The virtual detector component is configured to determine a virtually determined value based on the model and the at least one measurement value. The measurement device is configured to use the virtually determined value to determine a setting for the measurement device.

Further, embodiments of the present disclosure provide a method of setting a measurement device, with the following steps:

setting a measurement type to be performed;
inputting a signal to be measured;
measuring a measurement value via a physical detector of a signal processing component;
applying a model of a signal processing chain from the physical detector to the location of a virtual detector, the model using at least one model parameter for the signal processing chain;
using the model and the at least one measurement value to determine a virtually determined value; and
determining a setting for the measurement device based on the virtually determined value.

Accordingly, the measurement device itself, while knowing the intended measurement type, the internal setting as well as its respective influences on the measurement results, automatically detects if the current setting provides optimal measurement results. In other words, the measurement device internally verifies if the signal to be measured is well conditioned. Signal conditioning means to manipulate an input signal, namely the signal to be measured, in such a way that it meets the requirements of the next stage for further processing. The next stage for further processing corresponds to one of the signal processing components, for instance the one with physical detector or rather the one without physical detector.

For verifying the setting, the measurement device according to the present disclosure takes the physically measured measurement value as well as the virtually determined value into account, wherein the latter one was determined by the virtual detector component based on the model of the signal processing chain. The model provides information how the signal to be measured is internally handled by the measurement device, for instance by the signal path, also called signal processing chain. Particularly, the model provides information how the signal to be measured is handled from the signal processing component with physical detector to the location of the signal processing component without virtual detector such that the signal path from the physical detector to the location of the virtual detector is modelled or rather simulated.

Generally, the user does not have to be an expert of the measurement device in order to perform measurements on the signal to be measured yielding optimum measurement results, as the measurement device itself knows its internal settings as well as the assigned influences related to the signal processing. Accordingly, the operator does not necessarily have to know all details of the measurement device, particularly the influencing parameters as well as their respective settings for the intended measurement type.

Put differently, the measurement device is configured to determine the required parameters of the measurement device as well as their optimal values dependent on the intended measurement type for the signal to be measured.

These parameters and their optimal values can be determined, as the virtual detector component is provided that takes the model of the signal processing chain, namely the internal signal path of the measurement device, into account.

Generally, the measurement device is configured to consider the measurement type to be performed.

In other words, information from the type of measurement is taken into account when determining the setting of the measurement device yielding optimal measurement results.

For instance, the measurement value associated with the respective signal processing component may relate to a final measurement after acquisition of the input signal. This may relate to an analog to digital converter (ADC) with an overload flag.

In general, a physical detector that physically measures the measurement value assigned to a signal processing component, provides information concerning the specific hardware component, namely the signal processing component. Hence, the physical detector may inform a user concerning problems, for instance an overload of the signal processing component such as an analog-to-digital converter (ADC).

The measurement device according to the present disclosure also takes a non-measured value, namely the at least one virtually determined value, into consideration by applying the model having the at least one model parameter. The virtually determined value obtained is used by the measurement device to determine the influence(s) of the current internal setting and to verify whether or not the current setting(s) yield(s) optimum measurement results while providing a signal well-conditioned.

Put differently, the measurement device determines the setting for the measurement device, which yields optimum measurement results while providing a signal well-conditioned.

This setting may be compared with the current one in order to identify deviations causing non-optimum measurement results.

The at least one model parameter used by the model may encompass information with regard to the current state of the measurement device, calibration data of the measurement device and/or other internal data useful for characterizing the signal processing chain.

Moreover, the measurement device is configured to dynamically model the signal processing chain, particularly to dynamically adapt the at least one model parameter used by the model providing the virtually determined value.

Hence, less time and experience is required to operate the measurement device in an appropriate manner. Thus, less experienced operators may use the measurement device while achieving good measurement results, namely the optimal ones.

In some embodiments, the virtually determined value is assigned to a parameter without hard threshold.

The virtually determined value may relate to a parameter, which optimum value depends on the type of measurement.

Thus, the signal processing component to which the virtual detector is assigned may be a signal processing component without hard threshold, as the threshold depends on the type of measurement. For instance, the signal processing component is a mixer, wherein more or less distortion introduced by the measurement device is acceptable depending on the respective measurement type.

According to an aspect, the measurement device is configured to determine the setting for the measurement device also based on the measurement value. Thus, the measurement device takes the virtually determined value as well as the measurement value into account in order to determine the setting for the measurement device yielding optimum measurement results while providing a signal well-conditioned.

Further, the virtual detector may simulate a physical detector. The model applied is used to simulate the behavior or rather characteristics of the signal to be measured, particularly from the last physical detector to the location of the virtual detector. By using the model and applying the respective model parameter(s), it is ensured that a value, which would have been detected by a physical detector, is outputted as the virtually determined value. Thus, the virtual detector simulates a physical detector.

In other words, the virtually determined value may correspond to a physically measured measurement value assigned to the signal processing component without physical detector. As mentioned above, the virtual detector is associated with a signal processing component without physical detector. As the virtual detector simulates a physical detector, the respective output value of the virtual detector (component) relates to a physical measurement value under the assumption that the model applied matches.

According to another aspect, the virtual detector component comprises a plurality of virtual detectors. Thus, several different virtual detectors may be used which can be selected.

The number and the kind of virtual detectors used by the virtual detector component may depend on the measurement type. Put differently, the virtual detector component selects the virtual detector(s) used by the model for modelling the signal processing chain, namely the internal signal path.

Further, the measurement device may have a plurality of signal processing components with a respective physical detector. Thus, several different measurement values may be gathered by the respective signal processing components having a physical detector.

According to another aspect, the measurement device comprises a user interface via which the measurement type is settable. In other words, an operator of the measurement device may set the respective measurement type when testing a device under test that provides the signal to be measured.

In addition, the measurement device may be configured to automatically output a recommendation regarding the setting determined. Thus, the measurement device may automatically output a recommendation or rather a hint how to improve the setting(s) of the measurement device with regard to the signal to be measured depending on the measurement type selected. This may be done when the measurement device detects that the current setting(s) deviate(s) from the one yielding optimum measurement results.

According to another aspect, the measurement device is configured to automatically initiate a reconfiguration of the measurement device. Thus, the measurement device may automatically reconfigure itself with regard to the setting determined previously in order to ensure that the measurement results are optimized. In other words, the signal conditioning is improved by the measurement device itself without any interaction by the operator or rather user of the measurement device.

This may be done if the measurement device detects that the current setting(s) cause signal processing issues when processing the signal to be measured with the current setting(s). The signal processing issues may relate to a mixer compression, an overload of an amplifier and/or a bandwidth mismatch.

The respective steps performed automatically by the measurement device may be forwarded to the operator in order to inform the operator concerning the automatic reconfiguration.

Another aspect provides that the measurement device is configured to automatically load the setting determined. The setting determined may be stored internally in an internal storage of the measurement device. Thus, the respective setting is simply loaded from the internal storage and applied. In other words, there is no need for a complete reconfiguration, as the respective setting is already known.

Furthermore, the measurement device may have at least one input via which the signal to be measured is inputted. The device under test may be connected with the measurement device via its input so that an output signal of the device under test is forwarded to the measurement device via the input for measuring purposes. The measurement device internally processes the signal received by its signal processing components, which may have an associated physical detector or not.

Another aspect provides that the virtual detector component is a software module. As the model is executed by the virtual detector component, the virtual detector component may be assigned to a processor that performs the respective steps in order to determine the virtually determined value. The respective steps may also be carried out by one or more circuits, etc., in some embodiments.

In general, a device under test is connected to the measurement device that is set to a certain state. The measurement device itself analyzes the signal to be measured and its internal settings. Based on the signal to be measured as well as the internal settings, the measurement device estimates if the current settings lead to suboptimal measurement results, namely if the signal is not well-conditioned.

If the measurement device comes to the conclusion that the internal settings, namely the current settings, are not optimized with respect to the signal to be measured as well as the intended measurement type, the measurement device determines a setting for the measurement device providing better or rather the optimal measurement results.

The measurement device may issue a warning or rather a recommendation while providing hints how to improve the signal conditioning, namely the setting(s).

In other words, the user of the measurement device is warned by the measurement device itself if the measurement device is set to suboptimal parameters with respect to the signal to be measured and the intended measurement type. Thus, a faster error search is ensured.

As the measurement device also provides hints to improve the performance, the measurement results can be improved in a faster and easier manner.

The warning may relate to a clock jitter, a noisy clock signal, an underload caused by too much attenuation, an underload caused by a switched off pre-amplifier, an attenuation and pre-amplifying conflict, a too high mixing level (compression), a bandwidth mismatch, a carrier frequency offset, a carrier frequency drift, a too short acquisition time, a voltage standing wave ratio (VSWR), image frequencies captured, no signal found, no cable connected, a wrong trigger level and/or a too small trigger bandwidth.

Accordingly, recommendations or rather hints are provided such as check clock/trigger signal, increase power of clock/trigger signal, decrease attenuation, consider using pre-amplifier, decrease attenuation or switch off pre-amplifier, increase attenuation, increase measurement bandwidth, change center frequency to carrier frequency, increase acquisition time to a defined time, increase attenuation, add matching network, use hardware filter to suppress image frequencies, use trigger level, e.g. a certain percentage below signal power, deactivate trigger, reduce span and/or deactivate YIG filter.

A "check conditioning" function may be used, for instance by means of a button, in order to trigger a series of measurements to check for all possible conditioning problems.

Further, individual warnings may be activated and/or deactivated, for instance if it is normal that a certain warning comes if a certain measurement is conducted, i.e. depending on loaded application.

In addition, different levels of warnings may be provided for different strengths of effects.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
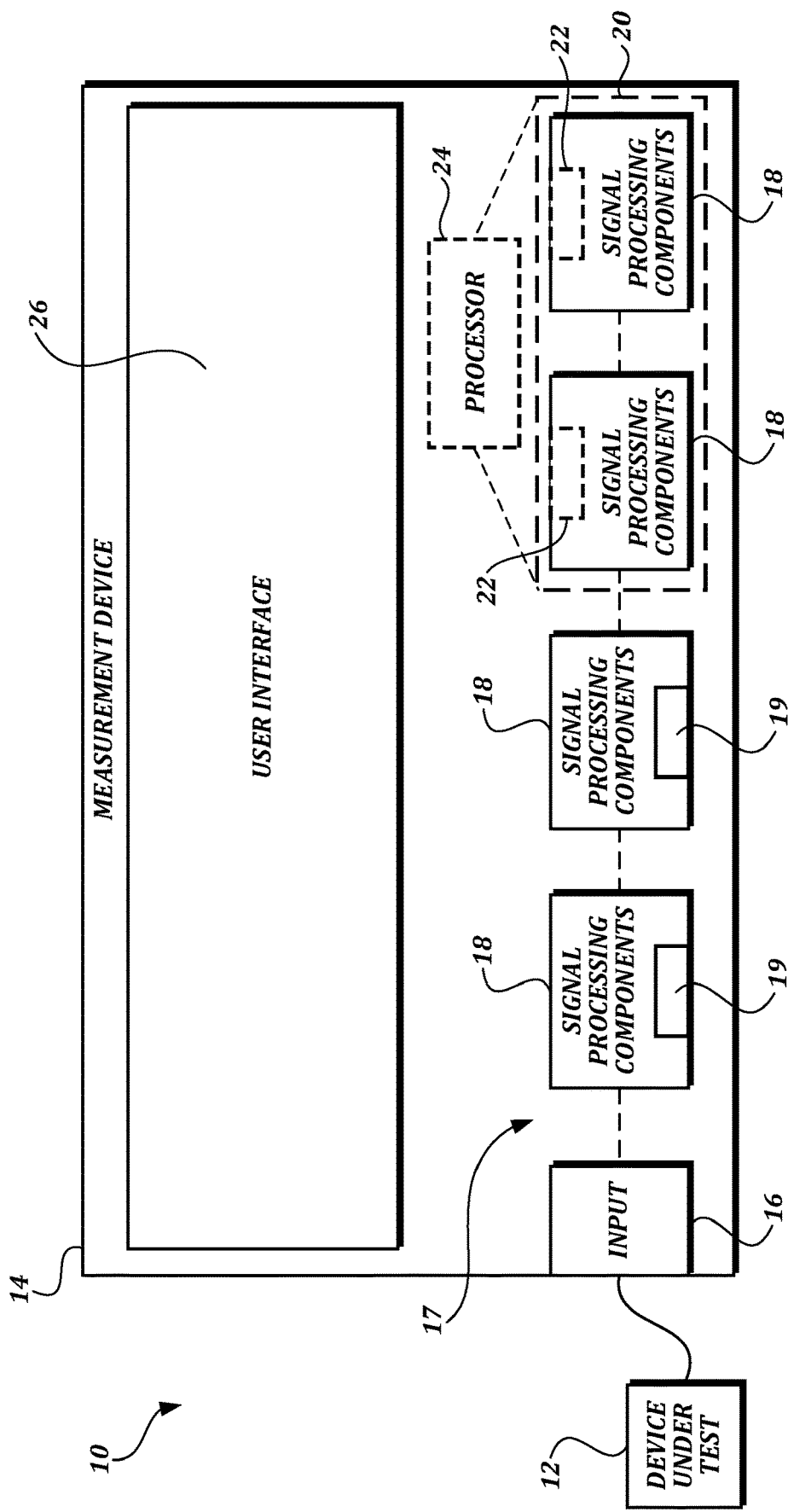
FIG. 1 schematically shows an overview of a measurement system comprising a measurement device according to the present disclosure.

FIG. 1 schematically shows a measurement system 10 that comprises a device under test 12 and a measurement device 14 with automatic optimization capabilities. The device under test 12 is connected with the measurement device 14 so that a signal outputted by the device under test 12 is forwarded to the measurement device 14 for measurement purposes. For example, the measurement device 14 has an input 16 at a frontend, via which the device under test 12 is connected with the measurement device 14 in a signal transmitting manner, for instance by a cable connection, in order to receive a signal to be measured.

As shown in FIG. 1, the measurement device 14 has a signal processing chain 17 originating from the input 16. The signal processing chain 17 comprises several signal processing components 18. Some of the signal processing components 18 have a physical detector 19 configured to measure a measurement value of the respective signal processing component 18 when processing the signal to be measured. As non-limiting examples, the signal processing components 18 can include analog and/or digital devices, such as filters, amplifiers, samplers, mixers, integrators, processors, conditioners, oscillators, DSPs, FPGAs, converters (e.g., A/D, D/A, etc.), etc.

In addition, the measurement device 14 has a virtual detector component 20 that comprises several virtual detectors 22. Each of the virtual detectors 22 is assigned to a signal processing component 18 without physical detector. Hence, it is not possible to retrieve a physically measured measurement value of the respective signal processing component 18, as no physical detector is assigned to those signal processing components 18.

In some embodiments, the virtual detector component 20 is a software module. In some embodiments, the measurement device 14 has an internal processor 24 assigned to the virtual detector component 20. For example, the processor 24 provides the virtual detectors 22, as will be described hereinafter. In other embodiments, one or more logic circuits can be used to carry out the functionality or methodology of the virtual detector.

The virtual detector component 20 is generally configured to use a model of the signal processing chain 17, namely the signal processing path, from one of the physical detectors 19 to the location of a respective virtual detector 22. The model comprises at least one model parameter for the signal processing chain 17. As already mentioned above, the signal processing chain 17 corresponds to the internal signal path of the measurement device 14 used for internally processing the signal received via the input 16. In other words, the internal signal processing is modelled by the model from the physical detector 19 to the location of the virtual detector 22.

The measurement device 14 is configured to use the model and the at least one measurement value obtained by the physical detector 19 in order to determine a virtually determined value at the location of the respective virtual detector 22, namely the associated signal processing component 18. The virtually determined value corresponds to a physically measured measurement value that is assigned to the signal processing component 18 without physical detector.

In other words, the measurement device 14 is configured to simulate a physical detector by means of the virtual detector component 20 when using the respective model. In fact, it is simulated by the virtual detector component 20 how the signal is processed by the measurement device 14 up to the location of the virtual detector 22.

The starting point of the simulation may be the physical detector 19 located prior to the location of the respective virtual detector 22.

As the virtual detector component 20 has several virtual detectors 22 that do not have to be taken into consideration each time, the virtual detector component 20 is generally configured to adapt the model applied, particularly the at least one model parameter, or rather the active virtual detectors 22.

For instance, this is done with respect to a selected measurement type for the signal to be measured. The measurement type may be selected by an operator of the measurement device 14 via a user interface 26, which can be provided at a front end of the measurement device 14, for instance by a touch-sensitive display. Alternatively, a button or any other input member can be used for selecting the respective measurement type intended.

In other words, the user may select or rather set a certain measurement type to be performed on the device under test 12.

Depending on the measurement type selected, the measurement device 14 adapts the virtual detector component 20, particularly the virtual detectors 22 and/or the model, in order to gather the virtually determined value that is used to determine the setting(s) of the measurement device 14 yielding optimum measurement results while providing a signal well-conditioned for the next stage of further processing.

As already stated above, the measurement type selected may also influence the at least one model parameter used by the model, particularly the respective value(s) selected, as the signal processing chain 17 may be adapted due to the respective measurement type selected.

In any case, the virtual detector component 20 determines the virtually determined value based on the model and the at least one measurement value gathered by the physical detector 19.

Then, the virtually determined value is used by the measurement device 14 itself in order to determine a setting for the measurement device 14 yielding optimum measurement results with respect to the measurement type selected.

This setting determined may be compared with the current setting in order to verify whether or not a new setting or rather an adapted one is necessary. In other words, the measurement device 14 automatically determines whether the current setting is optimal for the measurement type intended or not.

Should the measurement device 14 detect that the current setting is not optimal for the intended measurement type, the measurement device 14 automatically outputs a recommendation regarding the setting determined so that the user of the measurement device 14 is warned or rather informed with regard to the non-optimal current setting of the measurement device 14.

Additionally or alternatively, the measurement device 14 may automatically initiate a reconfiguration of the measurement device 14 according to the setting determined or rather load the respective setting determined, which yields optimal measurement results with regard to the measurement type intended, as the signal is well conditioned.

Figure 2:
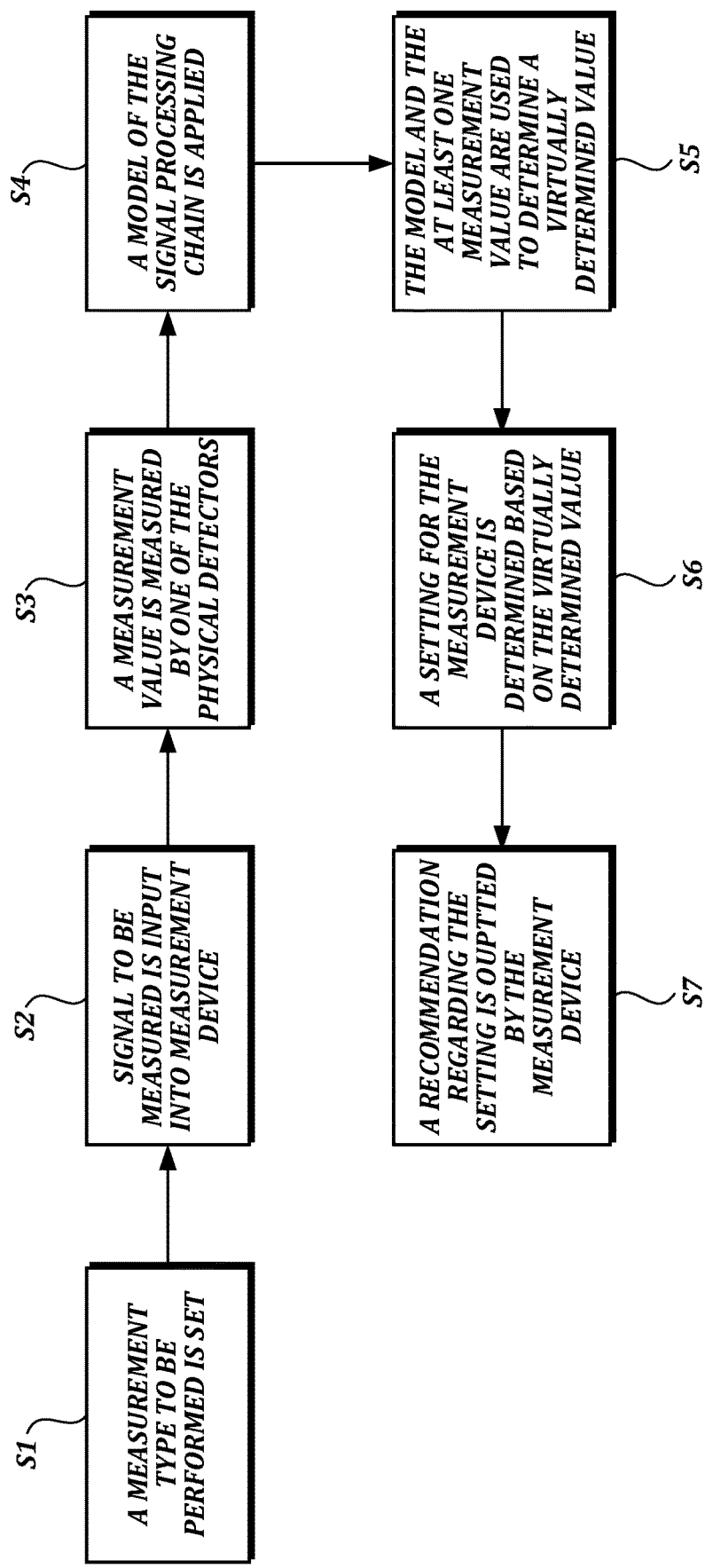
FIG. 2 shows a flow-chart illustrating a method of setting a measurement device according to the present disclosure.

Referring to FIG. 2 illustrating a flow-chart of a method of setting the measurement device 14, the following steps are performed.

In a first step S1, a measurement type to be performed is set. This may be done by the user via the user interface 26.

In a second step S2, the signal to be measured is inputted to the measurement device 14 via the input 16.

In a third step S3, a measurement value is measured via one of the physical detectors 19 assigned to a corresponding signal processing component 18.

In a fourth step S4, a model of the signal processing chain 17 is applied, wherein the model covers the signal processing chain 17 from the physical detector 19 to the location of the respective virtual detector 22. The model uses at least one model parameter for the signal processing chain 17, which may be altered dependent on the measurement type set.

In a fifth step S5, the model and the at least one measurement value are used to determine a virtually determined value.

In a sixth step S6, a setting for the measurement device 14 is determined based on the virtually determined value (and optionally on the measurement value).

In a seventh step S7, a recommendation regarding the setting determined is automatically outputted by the measurement device 14, particularly via the user interface 26 in order to inform the operator. Alternatively or additionally, a reconfiguration of the measurement device 14 is automatically initiated by the measurement device 14 in order to set the setting determined yielding optimum measurement results while providing a signal well-conditioned.

In other words, the measurement device 14 estimates based on the signal to be measured, the intended measurement type as well as the current settings if the current settings lead to suboptimal measurement results or not.

The internal settings as well as their influences on the measurement results are determined by means of the model applied in order to determine the influence of signal processing components without physical detector.

In some embodiments, the influence on the measurement result is checked by means of the model provided that the virtual detector 22 is assigned to a parameter without hard threshold so that the threshold to be applied inter alia depends on the measurement type selected.

The virtual detector 22 is assigned to a signal processing component 18 without physical detector 19.

Put differently, the measurement device 14 knows its internal settings as well as the respective influences in order to determine how the signal to be measured is processed by the measurement device 14 and to verify whether or not the signal to be measured is well conditioned for the next stage(s) of signal processing, namely the next signal processing components within the signal processing chain.

Accordingly, it is not necessary that the operator of the measurement device 14 has to be an expert with regard to the possible settings of the measurement device 14, particularly with regard to the different measurement types selectable.

Therefore, less experienced operators are enabled to use the measurement device 14 while achieving good measurement results, particularly optimal ones.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement device with automatic optimization capabilities, comprising:
   at least one signal processing component with a physical detector, said physical detector being configured to physically measure a measurement value assigned to said signal processing component; and
   a virtual detector component comprising at least one virtual detector for a signal processing component without physical detector,
   said virtual detector component being configured to use a model of a signal processing chain from said physical detector to the location of said virtual detector, said model comprising at least one model parameter for said signal processing chain;
   said measurement device being configured to adapt said virtual detector component with respect to a measurement type for said signal to be measured;
   said virtual detector component being configured to use said model and said at least one measurement value;
   said virtual detector component being configured to determine a virtually determined value based on said model and said at least one measurement value; and
   said measurement device being configured to use said virtually determined value to determine a setting for said measurement device.

2. The measurement device according to claim 1, wherein said measurement device is configured to determine said setting for said measurement device also based on said measurement value.

3. The measurement device according to claim 1, wherein said virtual detector simulates a physical detector.

4. The measurement device according to claim 1, wherein said virtually determined value corresponds to a physically measured measurement value assigned to said signal processing component without physical detector.

5. The measurement device according to claim 1, wherein said virtual detector component comprises a plurality of virtual detectors.

6. The measurement device according to claim 1, wherein said measurement device has a plurality of signal processing components with a respective physical detector.

7. The measurement device according to claim 1, wherein said measurement device comprises a user interface via which the measurement type is settable.

8. The measurement device according to claim 1, wherein said measurement device is configured to automatically output a recommendation regarding said setting determined.

9. The measurement device according to claim 1, wherein said measurement device is configured to automatically initiate a reconfiguration of said measurement device.

10. The measurement device according to claim 1, wherein said measurement device is configured to automatically load the setting determined.

11. The measurement device according to claim 1, wherein said measurement device has at least one input via which the signal to be measured is inputted.

12. The measurement device according to claim 1, wherein said virtual detector component is a software module.

13. A method of setting a measurement device, comprising:
   setting a measurement type to be performed;
   inputting a signal to be measured;
   measuring a measurement value via a physical detector of a signal processing component;
   applying a model of a signal processing chain from said physical detector to the location of a virtual detector by a virtual detector component, said model using at least one model parameter for said signal processing chain from said physical detector to the location of said virtual detector;
   adapting said virtual detector component with respect to said measurement type set using said model and said at least one measurement value to determine a virtually determined value; and determining a setting for said measurement device based on said virtually determined value.

14. The method according to claim 13, wherein said setting is also determined based on said measurement value.

15. The method according to claim 13, wherein a recommendation regarding said setting determined is automatically outputted.

16. The method according to claim 13, wherein a reconfiguration of said measurement device is automatically initiated.

\* \* \* \* \*

UNITED STATES PATENT AND TRADEMARK OFFICE
CERTIFICATE OF CORRECTION

PATENT NO. : 11,137,444 B2
APPLICATION NO. : 16/457585
DATED : October 5, 2021
INVENTOR(S) : M. Ruengeler et al.

Page 1 of 1

It is certified that error appears in the above-identified patent and that said Letters Patent is hereby corrected as shown below:

In the Claims

| Column | Line | |
| --- | --- | --- |
| 10 | 65 | Claim 13, delete "set" and insert -- set; --. |

Signed and Sealed this
Ninth Day of August, 2022

Katherine Kelly Vidal
*Director of the United States Patent and Trademark Office*